(12) United States Patent
Fang et al.

(10) Patent No.: US 6,471,782 B1
(45) Date of Patent: Oct. 29, 2002

(54) PRECURSOR DEPOSITION USING ULTRASONIC NEBULIZER

(75) Inventors: Ching-Ping Fang, Chandler, AZ (US); Joseph T. Hillman, Scottsdale, AZ (US)

(73) Assignee: Tokyo Electronic Limited, Tokyo (JP)

( * ) Notice: Subject to any disclaimer, the term of this patent is extended or adjusted under 35 U.S.C. 154(b) by 0 days.

(21) Appl. No.: 09/447,985

(22) Filed: Nov. 23, 1999

(51) Int. Cl.$^7$ .............................................. C23C 16/00
(52) U.S. Cl. ...................................... 118/726; 118/715
(58) Field of Search ................................. 118/726, 715

(56) References Cited

U.S. PATENT DOCUMENTS

| | | | | |
|---|---|---|---|---|
| 5,284,519 A | * | 2/1994 | Gadgil | 118/715 |
| 5,383,970 A | * | 1/1995 | Asaba | 118/726 |
| 5,616,208 A | * | 4/1997 | Lee | 118/715 |
| 5,766,342 A | | 6/1998 | Shibuya et al. | |
| 5,766,682 A | | 6/1998 | Tsubouchi et al. | |
| 5,835,677 A | * | 11/1998 | Li | 118/726 |
| 6,280,793 B1 | * | 8/2001 | Atwell | 118/726 |

FOREIGN PATENT DOCUMENTS

| JP | 7-273052 | * 10/1995 | |
|---|---|---|---|

OTHER PUBLICATIONS

Roger, Corbitt, Hampden–Smith, Kodas, *Aerosol–assisted chemical vapor deposition of copper: A liquid delivery approach to metal thin films*, American Institute of Physics, Applied Physics Letters, 65(1994) Aug. 22, No. 8, Woodbury, NY, US.

* cited by examiner

*Primary Examiner*—Richard Bueker
(74) *Attorney, Agent, or Firm*—Wood, Herron & Evans, L.L.P.

(57) ABSTRACT

A chemical vapor deposition (CVD) apparatus for depositing a low vapor pressure copper precursor onto a silicon wafer. The CVD apparatus includes a CVD reaction chamber with an interior containing a substrate holder adapted to support a substrate, such as a silicon wafer, at a predetermined position within the CVD reaction chamber. An ultrasonic nebulizer is operatively connected to the CVD reaction chamber and is adapted to connect to a source of liquid precursor. The ultrasonic nebulizer has an atomizing discharge end adapted to atomize the liquid precursor and deposit the atomized precursor onto a substrate supported by the substrate holder. A gas distribution ring is disposed within the interior of the CVD reaction chamber for discharging a directionally oriented gas into the atomized precursor to direct the atomized precursor toward the substrate. Additional embodiments and methods for depositing the precursor are described.

11 Claims, 4 Drawing Sheets

PRECURSOR DEPOSITION USING ULTRASONIC NEBULIZER

FIELD OF THE INVENTION

This invention is directed to method and apparatus for depositing precursor onto a substrate and, more specifically, depositing a low vapor pressure copper precursor onto a silicon wafer using an ultrasonic nebulizer.

BACKGROUND OF THE INVENTION

In the manufacture of semiconductor wafers and of other similarly manufactured articles, sequences of processes including coating, etching, heat treating and patterning are sequentially employed. Most of these processes involve the chemical or physical addition or removal of material to or from a surface of a substrate, usually transported as a vapor.

Certain coating processes in such sequences are preformed by chemical vapor deposition (CVD). CVD is preferred, for example, in applying films to the differently facing surfaces of holes through underlying layers, as, for example, to apply conductive films for the purpose of making interconnections across insulating layers and the like. The quality of the overall semiconductor wafer can be significantly affected by the integrity of the coating deposited during the CVD process. Therefore, great attention should be used during the precursor deposition step of the manufacturing process.

One typical apparatus for applying metallic coatings to semiconductor wafers, such as those made from silicon, includes a CVD reaction chamber to which liquid precursor is supplied via a mass flow controller. Prior to entering the CVD reaction chamber, the liquid precursor is fed through an atomizer which atomizes the liquid precursor as it enters the CVD reaction chamber. The atomization of the liquid precursor and subsequent evaporation into a gas phase is an essential step in the deposition process. To rapidly vaporize a low volatility liquid material into a gas phase, it is best to atomize the liquid into micron-size droplets first. This process increases the surface-to-volume ratio of the liquid precursor leading to increased evaporation rates.

Traditional atomizers use a carrier gas pressure differential in the vaporization process. This pressure differential can significantly decrease the temperature of the atomizing region because of adiabatic expansion. Consequently, the low temperature can slow down the evaporation process and even freeze the liquid precursor. Freezing precursor is especially problematic when depositing particular types of copper-based precursors onto a silicon wafer.

Another disadvantage of traditional atomizers is that they generate course droplets, i.e., greater than 100 microns. Because of their relatively large size, these droplets evaporate slowly with respect to their rate of travel through the vaporizer volume. The relatively large droplet size increases the probability of droplets colliding with each other or with the CVD reaction chamber wall before they evaporate completely. Collisions with the wall of the reaction chamber can lead to copper deposition onto the CVD reaction chamber walls. Collisions between droplets can lead to the combination of two smaller droplets into a single, larger droplet, further increasing the time for complete evaporation.

What is needed, therefore, is an apparatus and method for atomizing liquid precursors quickly and efficiently. More specifically, a liquid precursor atomization apparatus should atomize liquid precursor into small droplets to increase their evaporation rate.

SUMMARY OF THE INVENTION

The problems discussed above are overcome by the present invention which utilizes an ultrasonic nebulizer cooperating with a CVD reaction chamber in which semiconductor wafers, such as silicon wafers, are coated. The ultrasonic nebulizer converts high frequency electrical energy into mechanical displacement to precisely atomize small volumes of the liquid precursor into micron-size droplets. The ultrasonic nebulizer mounts directly onto the cover member of the CVD reaction chamber, minimizing the distance that the vaporized precursor travels before reaching the silicon wafer onto which the precursor vapor is to be deposited. Minimizing the precursor travel distance also minimizes the opportunity for the precursor to contact other surfaces of the CVD reaction chamber which are not intended to receive the precursor deposition. Additionally, thermal convection from a heated sweeping gas assists in evaporating the precursor droplets atomized by the ultrasonic nebulizer. The heated sweeping gas replaces the conventional method of evaporation which relies upon the droplet impinging upon a heated surface which is at a temperature higher than the vaporization temperature for the liquid precursor. Preferably, the heated sweeping gas has a high heat capacity and low molecular weight such as hydrogen, helium, and argon. Use of these low molecular weight gases yields high binary diffusivity which greatly reduces evaporation time.

Therefore in accordance with the principles of the present invention a CVD apparatus for depositing a precursor onto a substrate includes a CVD reaction chamber with an interior containing a substrate holder adapted to support a substrate at a predetermined position within the CVD reaction chamber. An ultrasonic nebulizer is operatively connected to the CVD reaction chamber and is adapted to connect to a source of liquid precursor. The ultrasonic nebulizer has an atomizing discharge end adapted to atomize the liquid precursor and deposit the atomized precursor as a vapor onto a substrate supported by the holder. A gas distribution member is disposed within the interior of the CVD reaction chamber for discharging a directionally oriented gas into the atomized precursor to direct the atomized precursor toward the substrate. In one aspect of this embodiment, the directionally oriented gas is heated to further assist in the vaporization of the atomized precursor.

In one embodiment, a vaporization zone is provided around the ultrasonic nebulizer and the gas distribution ring. Specifically, side walls, a vaporizer plate, and the cover member of the CVD reaction chamber define the boundaries of the vaporization zone. The side walls particularly prevent any unvaporized precursor droplets from bypassing the vaporizer plate and possibly contacting the silicon wafer or the side walls of the CVD reaction chamber. Preferably, the vaporizer plate is heated to a temperature above the vaporization temperature of the particular precursor being deposited.

In another embodiment, the CVD reaction chamber includes a diffuser associated with the ultrasonic nebulizer and the gas distribution ring. The diffuser serves to maintain the atomized precursor and sweeping gas mixture with a uniform velocity front as it travels toward the silicon wafer. By properly choosing the diffuser geometry, the spread of the vaporized precursor is sufficient to cover the substrate surface without unfavorably contacting the CVD reaction chamber walls.

Various additional advantages, objects and features of the invention will become more readily apparent to those of ordinary skill in the art upon consideration of the following detailed description of the presently preferred embodiments taken in conjunction with the accompanying drawings.

DETAILED DESCRIPTION OF THE DRAWINGS

DETAILED DESCRIPTION OF PREFERRED EMBODIMENTS

Figure 1A:
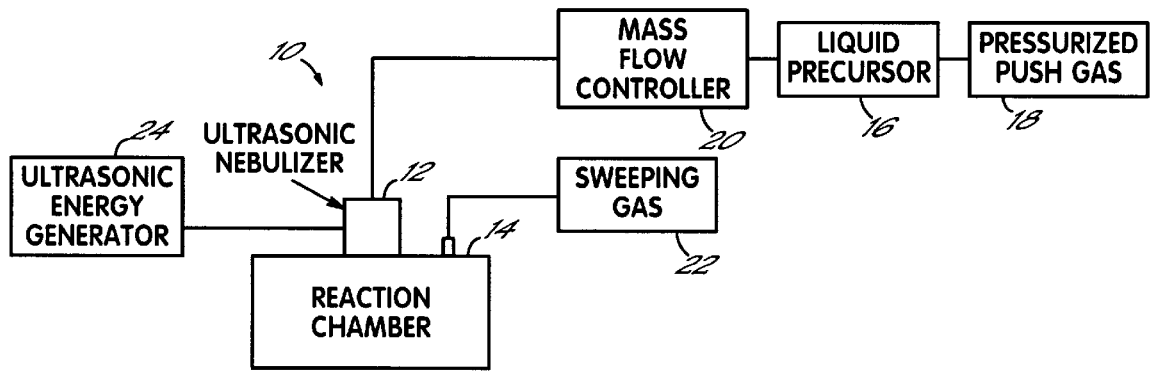
FIG. 1A is a schematic representation of a CVD apparatus utilizing an ultrasonic nebulizer affixed to a CVD reaction chamber.

As shown schematically in FIG. 1A, a CVD apparatus 10 integrates an ultrasonic nebulizer 12 with a CVD reaction chamber 14 in accordance with the principles of the present invention in order to overcome the known problems of precursor injection using traditional atomizers. The CVD apparatus 10 is connected to a source of liquid precursor 16 which is propelled by a source of pressurized push gas 18 to a mass flow controller 20. The mass flow controller 20 precisely measures or meters the flow of the liquid precursor into the ultrasonic nebulizer 12. One particular mass flow controller suited for use in this invention is Liquid-Flow model number LMA-05-3-E-0 manufactured by Bronkhorst and available through Porter Instruments, Scotts Valley, Calif. 95066. Although the CVD apparatus 10 is capable of depositing a wide variety of precursors onto a semiconductor wafer, such as a silicon wafer, the CVD apparatus is especially adapted to use a copper-based precursor, such as CupraSelect™ Blend also know as "Copper-HVAC-TMVS", to deposit a copper film onto the silicon wafer. CupraSelect™ Blend is available from Schumacher, Carlsbad, Calif. 92009. A source of sweeping gas 22 is connected to the CVD reaction chamber 14. Advantageously, the sweeping gas is of the type that does not react with the copper-based precursor, such as for example hydrogen or helium. One advantage of using hydrogen is that it creates a reducing environment which prevents the deposited metal from oxidizing. One advantage of using helium is that it has a high specific heat. An ultrasonic energy generator 24 is connected to the ultrasonic nebulizer 12 to provide ultrasonic energy to the ultrasonic nebulizer 12 sufficient to atomize the liquid precursor.

Figure 1B:
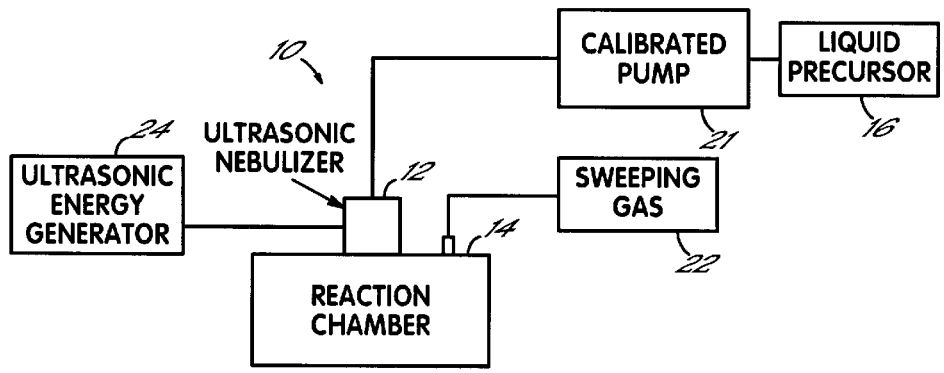
FIG. 1B is another schematic representation of a CVD apparatus utilizing an ultrasonic nebulizer affixed to a CVD reaction chamber.

The schematic in FIG. 1B illustrates the liquid precursor being delivered to the reaction chamber 14 by a slightly different technique. A calibrated pump 21 such as the type used for liquid chromatography replaces the mass flow controller 20. One advantage of using the calibrated pump 21 is that it does not require the use of the pressurized push gas 18, thereby reducing the complexity of the CVD apparatus 10.

Figure 2:
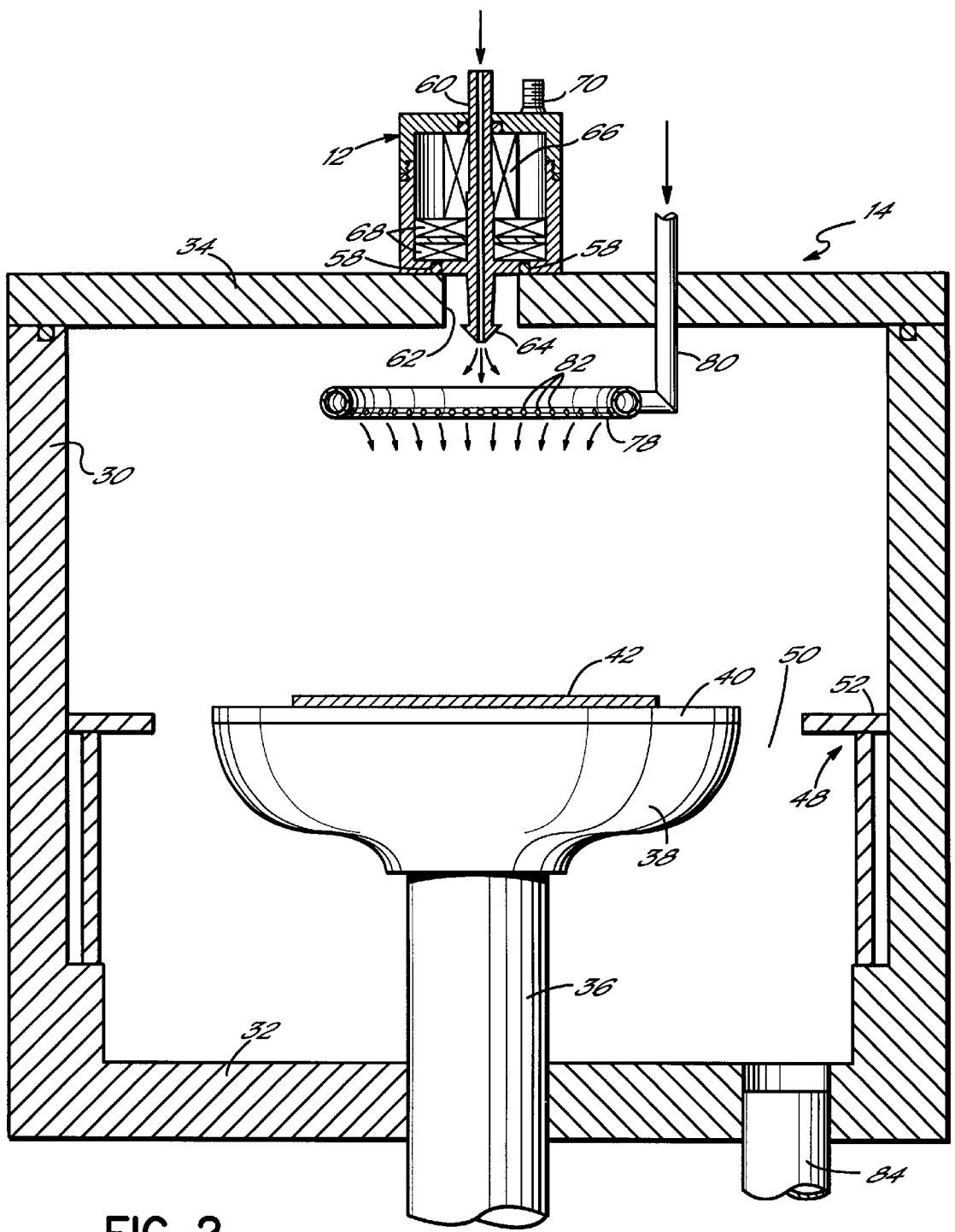
FIG. 2 is a enlarged cross-sectional view of one embodiment of the CVD apparatus of the present invention utilizing an ultrasonic nebulizer affixed to a CVD reaction chamber.

With reference to FIG. 2, a particular embodiment of the CVD apparatus 10 is shown in accordance with the principles of the present invention. The CVD reaction chamber 14 has side and bottom walls 30, 32 and a cover member 34 sealingly engaging the side walls 30 to form an enclosed chamber. Preferably, the side walls 30 are cylindrical and sized to withstand a vacuum within the CVD reaction chamber 14. Protruding through the bottom wall 32 is a support member 36 to which a heater housing 38 is affixed. The heater (not shown) contained within the heater housing 38 is a resistance heater. Further details about the construction and operation of the heater can be found in U.S. Pat. No. 5,562,947, which is incorporated fully herein by reference. A susceptor 40 is operatively disposed atop the heater housing 38, and a substrate, such as a silicon wafer 42, rests upon the susceptor 40. During the deposition process, the heater contained within the heater housing 38 heats up the susceptor 40 and thus the silicon wafer 42. Preferably, the silicon wafer is maintained at a temperature of about 200° C. At this temperature the susceptor is preferably an aluminum plate. For temperatures substantially greater than 200° C., the susceptor is preferably a nickel alloy plate.

The CVD reaction chamber 14 also includes an annular exhaust baffle 48 mounted to the side walls 30. The exhaust baffle creates an annular space 50 around the susceptor 40 through which exhausted process gasses pass. Generally, the exhaust baffle 48 is concentrically aligned with the susceptor 40 such that the annular space 50 between the exhaust baffle 48 and the susceptor 40 is uniform. However, the exhaust baffle includes a ring member 52 which can be shaped so that the annular space 50 is not uniform around the susceptor 40, allowing more exhaust gas to pass through a wide point in the annular space 50 than a narrow point. Because the ring member 52 can be specific tailored to create an asymmetric annular space 50, the flow of process gas over the silicon wafer 42 can be optimally tailored. Additional aspects of the exhaust baffle 40 can be found in U.S. Pat. No. 5,356,476, which is incorporated fully herein by reference.

The ultrasonic nebulizer 12 sealingly engages cover member 34 via seal member 58. The ultrasonic nebulizer 12 includes a liquid precursor feed channel 60 through which the liquid precursor from the precursor source 16 travels. The liquid precursor feed channel 60 extends through the ultrasonic nebulizer 12 and through a throughhole 62 in the cover member 34 and terminates at an atomizing discharge end 64. The ultrasonic nebulizer 12 further includes a rear horn 66 which encircles the liquid precursor feed channel 60. The ultrasonic nebulizer 12 also includes a plurality of piezoelectric-transducers 68 which encircle the liquid precursor feed channel 60. The ultrasonic energy generator 24 is operatively connected to the piezoelectric transducers 68 via electrical connector 70.

In operation, the piezoelectric transducers 68 receive high frequency electrical energy from the ultrasonic energy generator 24, and convert that energy into vibratory mechanical motion at the same frequency. The piezoelectric transducers 68 are operatively coupled to the rear horn 66 which amplifies the motion of the piezoelectric transducers 68. The excitation created by the piezoelectric transducers 68 produces standing waves along the length of the liquid precursor feed channel 60, the amplitude of which is maximized at the atomizing discharge end 64. This exaggerated excitation at the atomizing discharge end 64 atomizes the precursor as it is discharged therefrom. One particular ultrasonic nebulizer 12 suited for use in the CVD apparatus 10 is Model 12335 available from Sono-Tek, Milton, N.Y. 12547.

A gas distribution ring 78 is disposed beneath and coaxially aligned with the longitudinal axis of the liquid precursor feed channel 60. A gas supply tube 80 is connected to the gas distribution ring 78 to which it supplies sweeping gas provided by the sweeping gas source 22. The gas distribution ring 78 includes a plurality of evenly spaced apart discharge holes 82 pointed inwardly toward the center of the gas distribution ring 78. Preferably the gas distribution ring 78 is made from ¼ inch OD stainless steel tube. The discharge holes 82 are about 0.5 mm in diameter and spaced about 1 cm apart. The gas supply tube 80 is also made from ¼ inch OD stainless steel tube. The sweeping gas has a flow rate in the range of about 50–500 sccm, preferably 100 sccm. The sweeping gas can be distributed through the distribution ring 78 at pressures in the range of about 0.5 to about 5.0 Torr and temperatures in the range of about 0 to 100 C.

The sweeping gas discharged from the discharge holes 82 mixes with the atomized precursor, giving the overall gas mixture a substantial velocity in the direction of the silicon wafer 42. Depending on the particular deposition process, the sweeping gas is discharge at about 20 C. At this temperature the sweeping gas contributes little to the evaporation of the precursor exiting the ultrasonic nebulizer 12, but instead serves primarily to direct the precursor towards the silicon wafer 42. However, it may be advantageous to heat the sweeping gas to assist in the evaporation process. In this instance, the sweeping gas is heated to between about 50–100 C., preferably about 60 C. As the heated sweeping gas mixes with the atomized precursor discharged from the atomizing discharge end 64 of the ultrasonic nebulizer 12 the vaporization rate of the atomized precursor increases noticeably. The waste exhaust gases exit from the otherwise sealed CVD reaction chamber 14 via exhaust port 84. It will be appreciated that the gas distribution ring 78 could be removed altogether from the CVD reaction chamber 14. However, the vaporization effectiveness would be significantly decreased, possibly leading to unvaporized precursor contacting the side or bottom walls 30, 32 or the silicon wafer 42.

In operation, liquid precursor from source 16 is supplied to the liquid precursor feed channel 60 on the ultrasonic nebulizer 12. The liquid precursor, such as CupraSelect™ Blend, enters the ultrasonic nebulizer 12 at a flow rate in the range of about 0.2 to 3.0 ml/min, preferably at about 0.5 ml/min and a temperature in the range of about 0–60 C., preferably about 20 C. Increasing the flow rate has the effect of increasing the copper film deposition rate. Advantageously, any pressure which allows the precursor to flow through the tubing is workable, preferably the pressure is between about –5 to 5 psig, and most preferably atmospheric pressure. The ultrasonic energy generator 24 energizes the piezoelectric transducers 70 which establishes a standing wave along the liquid precursor feed channel 60 and atomizes the liquid precursor traveling therethrough. The atomized precursor discharges from the atomizing discharge end 64 and then mixes with the heated sweeping gas discharged from the discharge holes 82 in the gas distribution ring 78. The atomized precursor vaporizes as it is directed toward the silicon wafer 42. This entire deposition process is conducted while the CVD reaction chamber 14 is held at a pressure in the range of about 0.1 to 5 Torr, and preferably 0.5 Torr. After the silicon wafer 42 is coated, the supply of liquid precursor to the ultrasonic nebulizer 12 is stopped, the coated silicon wafer 42 is removed, and another uncoated silicon wafer 42 is placed atop the susceptor 40.

Figure 3:
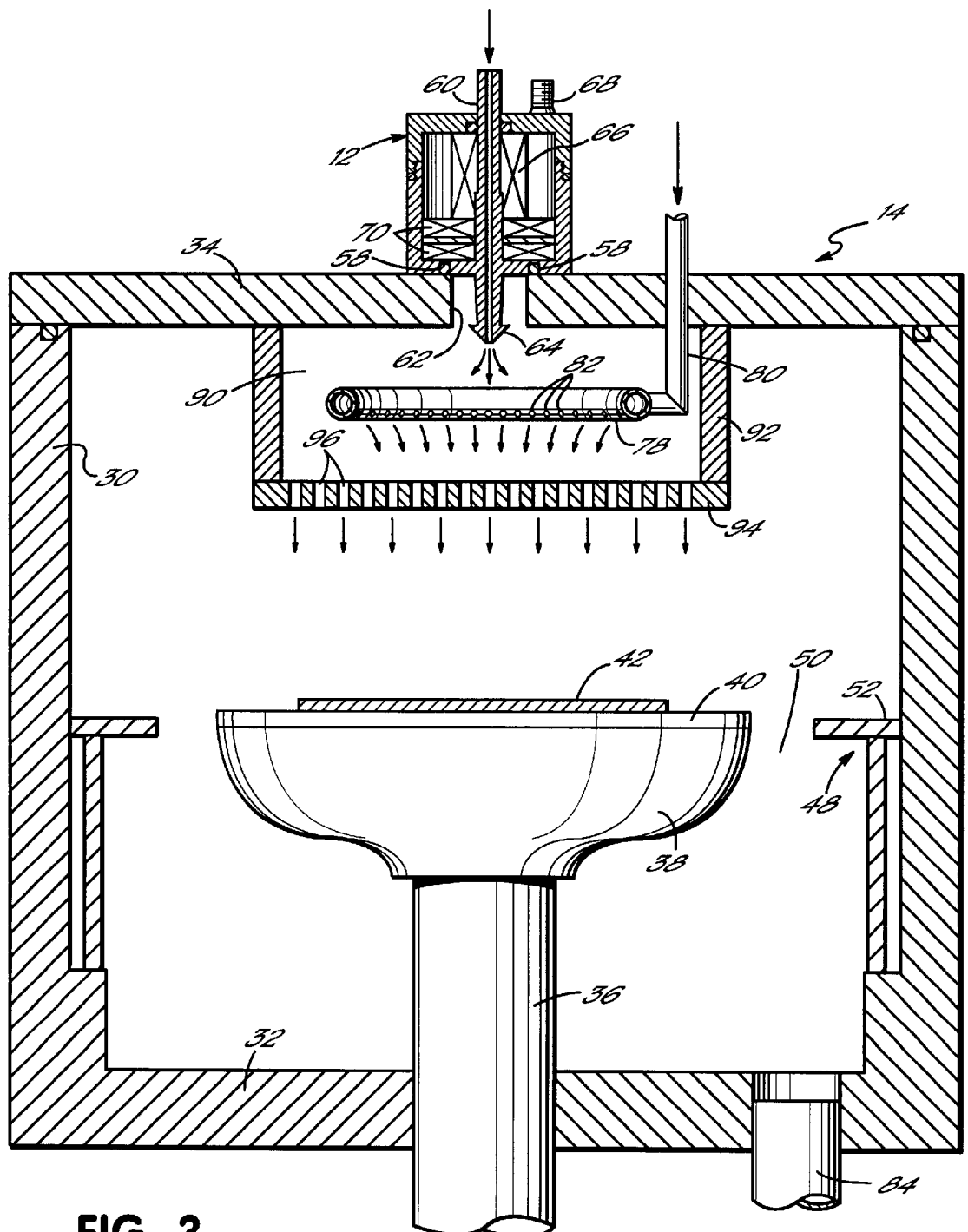
FIG. 3 is a enlarged cross-sectional view of another embodiment of the CVD apparatus of the present invention utilizing an ultrasonic nebulizer affixed to a CVD reaction chamber.

Another embodiment similar to embodiment described above is shown in FIG. 3. To further ensure that all of the atomized precursor vaporizes before reaching the silicon wafer or the side and bottom walls 30, 32, a vaporization zone 90 is provided around the ultrasonic nebulizer 12 and the gas distribution ring 78. Specifically, side walls 92, vaporizer plate 94, and cover member 34 define the boundaries of the vaporization zone 90. The side walls 92 particularly prevent any unvaporized precursor droplets from bypassing the vaporizer plate 90 and possibly contacting the silicon wafer 42 or the side walls 30 of the CVD reaction chamber 14.

The vaporizer plate 94 has a plurality of throughholes 96 oriented perpendicularly to the surface of the silicon wafer 42. Advantageously, the vaporizer plate 94 is made from thermally conducting metal which is corrosion resistant, such as a commercially pure nickel, a nickel-base alloy such as Hastalloy C-22, or an anodized aluminum. Preferably, the vaporizer plate 94 is heated to a temperature above the vaporization temperature of the particular precursor being deposited. For example, if CupraSelect™ Blend, a copper-based precursor, is utilized, the vaporizer plate 94 is heated to a temperature in the range of about 60–100° C. Consequently, any liquid droplets of precursor that do contact the vaporizer plate 94 will be vaporized instead of passing onto the silicon wafer 42. The throughholes 96 in the vaporizer plate 94 allow the sweeping gas and the precursor vapor to pass therethrough in a direction substantially toward the surface of the silicon wafer 42.

Figure 4:
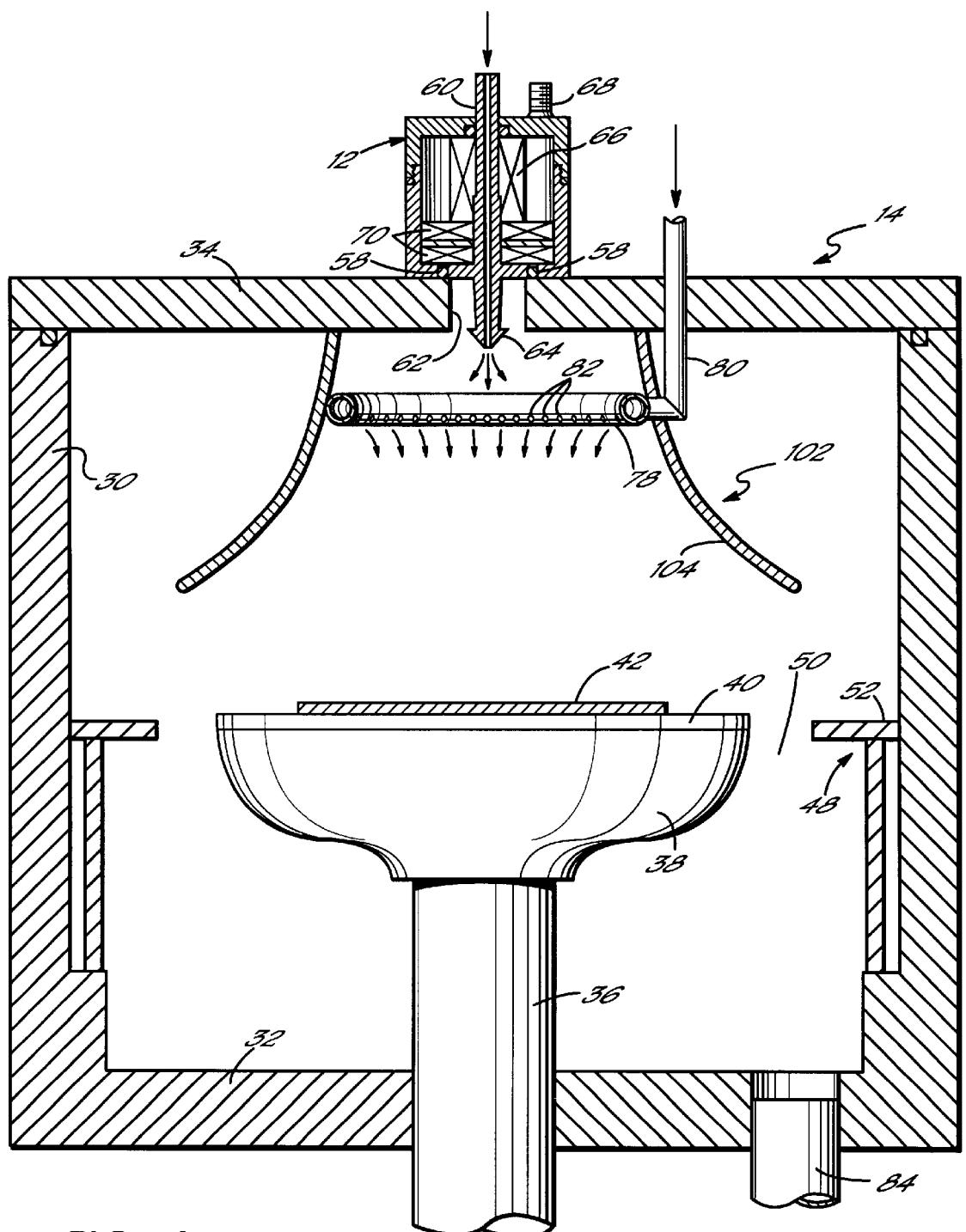
FIG. 4 is a enlarged cross-sectional view of still another embodiment of the CVD apparatus of the present invention utilizing an ultrasonic nebulizer affixed to a CVD reaction chamber.

Another embodiment similar to that shown in FIG. 2 is illustrated in FIG. 4. In this embodiment, a diffuser 102 is mounted to the cover member 34. The diffuser 102 is shaped substantially as a truncated cone with side walls 104 extending downwardly from the cover member 34 and diverging outwardly toward the side walls 32 of CVD reaction chamber 14. The profile of the side walls 104 is shaped so that the mixture of atomizing precursor and sweeping gas maintain a uniform velocity profile as the mixture flows toward the silicon wafer 42. That is, the diffuser 102 controls the expansion of the gaseous mixture as it travels toward the silicon wafer 42 such that the velocity of the gaseous mixture near the side walls 104 is approximately equal to the velocity along the diffuser's center line. By maintaining a uniform flow velocity, the vaporized precursor more uniformly coats the surface of the silicon wafer 42.

While the present invention has been illustrated by a description of various preferred embodiments and while these embodiments have been described in considerable detail in order to describe the best mode of practicing the invention, it is not the intention of the applicants to restrict or in any way limit the scope of the appended claims to such detail. Additional advantages and modifications within the spirit and scope of the invention will readily appear to those skilled in the art. The invention itself should only be defined by the appended claims, wherein we claim:

What is claimed is:

1. An apparatus for depositing a precursor onto a substrate, comprising:

a CVD reaction chamber with an interior containing a substrate holder adapted to support a substrate at a predetermined position within said CVD reaction chamber;

an ultrasonic nebulizer operatively connected to said CVD reaction chamber and adapted to connect to a source of liquid precursor, said ultrasonic nebulizer having an atomizing discharge end with a discharge axis adapted to atomize incoming liquid precursor and deposit the atomized precursor onto a substrate supported by said holder; and a gas distribution member disposed within the interior of said CVD reaction chamber and having a discharge ring downstream of said atomizing discharge end concentrically aligned with said discharge axis so that said atomized precursor passes through said discharge ring, said gas distribution member connectable to a source of gas for discharging a stream of sweeping gas that sweeps the atomized precursor in the direction of the substrate and onto the substrate.

2. The deposition apparatus of claim 1, further comprising:

a diffuser associated with said atomizing discharge end of said ultrasonic nebulizer, said diffuser being shaped such that the vaporized precursor maintains a substantially uniform velocity profile as it travels toward the substrate.

3. The deposition apparatus of claim 2, wherein said diffuser is shaped substantially as a truncated cone.

4. The deposition apparatus of claim 1, wherein said discharge ring has a plurality of spaced apart discharge holes along said discharge ring so as to discharge gas radially toward the atomized precursor passing through said discharge ring.

5. The deposition apparatus of claim 4, wherein the gas is heated to assist in the vaporization of the atomized precursor.

6. The deposition apparatus of claim 1, wherein the gas is heated to assist in the vaporization of the atomized precursor.

7. The deposition apparatus of claim 1, wherein the source of gas is hydrogen.

8. The deposition apparatus of claim 1, further comprising:

a heated vaporizer plate disposed between said gas distribution member and said substrate holder to assist in the vaporization of the liquid precursor.

9. The deposition apparatus of claim 8, wherein said vaporizer plate includes a wall extending therefrom and contacting said CVD reaction chamber to form an enclosure surrounding said gas distribution member and said atomizing discharge end of said ultrasonic nebulizer so as to minimize the ingress of liquid precursor into said CVD reaction chamber.

10. The deposition apparatus of claim 9, wherein said vaporizer plate has perforations allowing only vaporized precursor and discharge gas to pass therethrough.

11. The deposition apparatus of claim 9, wherein said vaporizer plate is heated to between about 60° C. and 100° C.

* * * * *